United States Patent
Downes, Jr. et al.

[11] Patent Number: 5,939,786
[45] Date of Patent: Aug. 17, 1999

[54] UNIFORM PLATING OF DENDRITES

[75] Inventors: Francis Joseph Downes, Jr.; Raymond Thomas Galasco, both of Vestal, N.Y.; Jaynal Abedin Molla, Chandler, Ariz.

[73] Assignee: International Business Machines Corporation, Armonk, N.Y.

[21] Appl. No.: 08/748,462

[22] Filed: Nov. 8, 1996

[51] Int. Cl.[6] .................................................. H01L 23/48
[52] U.S. Cl. .......................... 257/739; 257/734; 257/779
[58] Field of Search .................................... 257/734, 766, 257/768, 779, 739, 760

[56] References Cited

U.S. PATENT DOCUMENTS

| | | | |
|---|---|---|---|
| 5,019,944 | 5/1991 | Ishii et al. | |
| 5,118,299 | 6/1992 | Burns et al. | 439/74 |
| 5,172,473 | 12/1992 | Burns et al. | 29/885 |
| 5,185,073 | 2/1993 | Bindra et al. | 205/104 |
| 5,190,463 | 3/1993 | Datta et al. | 439/74 |
| 5,298,685 | 3/1994 | Bindra et al. | 174/250 |
| 5,435,057 | 7/1995 | Bindra et al. | 29/830 |

*Primary Examiner*—Peter Toby Brown
*Assistant Examiner*—Roy Potter
*Attorney, Agent, or Firm*—William N. Hogg; James A. Lucas

[57] ABSTRACT

The present invention provides uniform dendrites, on circuit features instead of large, elongated dendrites along the edges of the circuit features. The dendrites are formed by a method comprising the following steps: providing a substrate having circuitry disposed thereon; applying a photoresist to the substrate at a thickness which is preferably about the height of the intended dendrite height; imaging the photoresist to expose all or a portion of the top surface of the circuitry; forming the dendrites; and removing the photoresist. The photoresist which is employed to control the dendrite height is applied so that the photoresist either: abuts the edge of the circuitry leaving the top surface of the circuitry exposed; or abuts the edge of the circuitry and extend over the top edge of the circuitry so that a portion of the top surface of the circuitry is exposed; or does not touch the circuitry nor an area surrounding the base of the circuitry. The method of the present invention provides uniform dendrites, that is, the dendrites along the edge of the circuitry are within about 50%, preferably about 40%, more preferably within about 25% of the average dendrite height; preferably the dendrites along the edge of the circuitry are within 10% of the highest non-edge dendrite. The invention also relates to electronic structures having uniform dendrites disposed thereon.

5 Claims, 1 Drawing Sheet

UNIFORM PLATING OF DENDRITES

BACKGROUND OF THE INVENTION

Dendrites are used in a variety of packaging applications, primarily as connectors. Dendrites, including for example, palladium dendrites, are electrodeposited on circuitry. During the electro-deposition of the dendrites, large dendrites are formed at the edges of the circuitry. The presence of the large dendrites at the edge can result in lower yield or narrow process windows.

It is desirable to have a method of dendrite formation which provides uniform dendrites.

SUMMARY OF THE INVENTION

The present invention provides a novel method for forming uniform dendrites, on circuit features that does not result in large, elongated dendrites along the edges of the circuitry. The method comprises the following steps: providing a substrate having circuitry disposed thereon; applying a patternable resist, preferably a photoresist to the substrate at a thickness which is preferably about the height of the intended dendrite height; imaging the photoresist to expose all or a portion of the top surface of the circuitry; forming the dendrites; and removing the photoresist. The photoresist which is employed to control the dendrite height is applied so that the photoresist either: abuts the edge of the circuitry leaving the top surface of the circuitry exposed; or abuts the edge of the circuitry and extend over the top edge of the circuitry so that a portion of the top surface of the circuitry is exposed; or does not touch the circuitry nor an area surrounding the base of the circuitry.

The method of the present invention provides uniform dendrites, that is, the dendrites along the edge of the circuitry are within about 50%, preferably about 40%, more preferably within about 25% of the average dendrite height, excluding any dendrites that may form on the side walls of circuitry in certain embodiments. Preferably the dendrites along the edge of the circuitry are within 10% of the highest non-edge dendrite. Preferably, the height of each of the dendrites is within about 50% of the average dendrite height.

The invention also relates to electronic structures having uniform dendrites disposed thereon.

DETAILED DESCRIPTION OF THE PRESENT INVENTION

Figure 1:
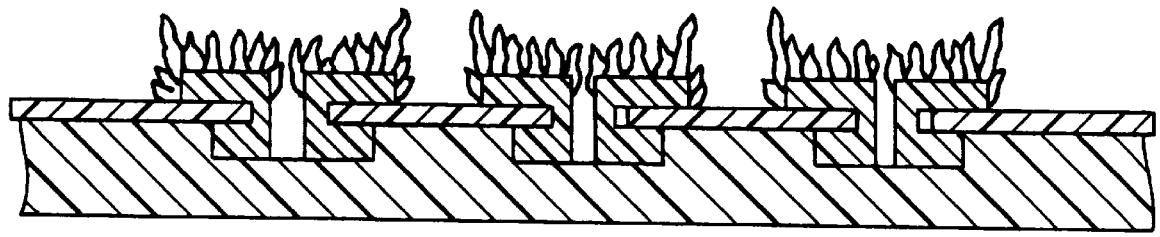
FIG. 1 shows a cross section of an electronic structure with irregular dendrites formed on the circuitry according to the methods of the prior art. The elongated dendrites are shown along the edge of the circuitry.

The present invention provides a novel method for forming uniform dendrites, preferably palladium dendrites, that does not result in large dendrites along the edges of circuitry. As shown in FIG. 1, which shows dendrites formed according to the methods of the prior art, elongated dendrites form along the edge of the circuitry.

The method of the present invention produces uniform dendrites and comprises the following steps. A patternable resist, preferably a photoresist, is applied preferably to both sides of the substrate. For the side upon which the dendrites are to be formed, the photoresist is preferably applied to a thickness about equal to the intended height of the dendrites. Where the height of the photoresist is applied to a thickness less than the intended dendrite height, the photoresist is preferably not less than 80% of the intended dendrite height. Alternatively, the photoresist is applied to a thickness higher than the intended dendrite height; preferably the photoresist height is no more than about 100% higher than the intended dendrite height. Where the circuitry is pads that are 1 mil in height and the dendrites that are to be about 0.5 to 3 mils in height, the photoresist is preferably to be at least 2.4 mil, and preferably from about 3 mil to 6 mils thick.

The photoresist is then photoimaged by exposure to actinic radiation, preferably ultraviolet light, according to the photoresist manufacture's instructions. The photoimaging is accomplished by exposure of the photoresist to the actinic radiation through artwork. The art work has windows which are transparent to the actinic radiation. The windows permit the actinic radiation to pass through the art work, to expose the underlying the photoresist.

Figure 2:
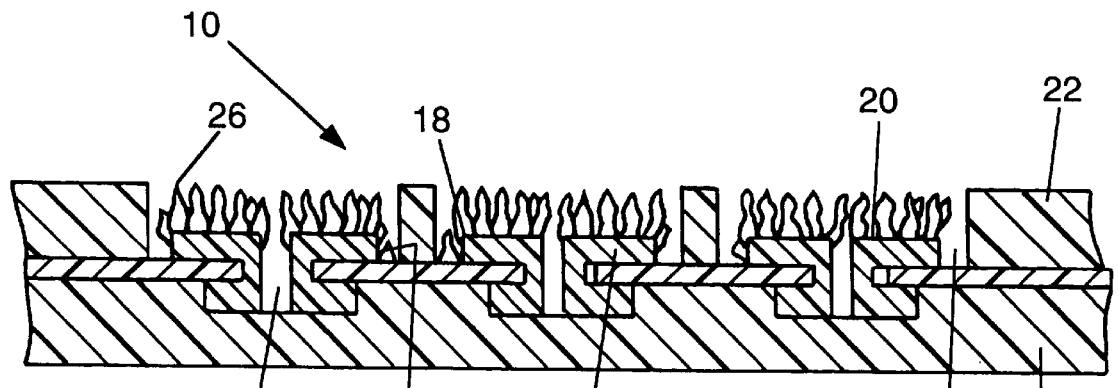
FIG. 2 shows an electronic structure with circuitry and uniform dendrites plated on the circuitry, according to an embodiment of the present invention, before the photoresist is stripped. The photoresist is disposed on the substrate, a photoresist free zone is shown surrounding the circuitry.

Referring to FIG. 2 which shows an embodiment of the present invention, an electronic structure 10 is shown with patterned resist after the dendrites 26 are formed. The structure 10 is made by providing substrate 12 having circuitry 14 disposed thereon. Circuitry 14 has side wall 16, edge 18 and top surface 20. Photoresist 22 is applied so as to leave a photoresist-free zone 24 around the circuitry 14. Specifically, the photoresist 22 is exposed to actinic radiation through art work so that only the photoresist 22 on the top surface 20 of the circuitry 14, the sidewall 16 and the zone 24 surrounding the circuitry 14 are not exposed. As a result, upon development of the photoresist 22, the photoresist 22 remains upon the substrate 12; while the top surface 20 of the circuitry 14, the side wall 16 of the circuitry 14 and the zone 24 surrounding the circuitry 14 are free of photoresist 22. The photoresist free zone 24 preferably has an area of about 1 to 30%, preferably 10 to 15%, of the feature diameter, from the side-wall 16 of the circuitry 14. Where the circuitry 14 is a 10 mil diameter pad, the photoresist free zone 24 preferably extends from the sidewall 16 of the circuitry 14 at least 1 mil, more preferably about 1 mil to about 3 mil.

Figure 3:
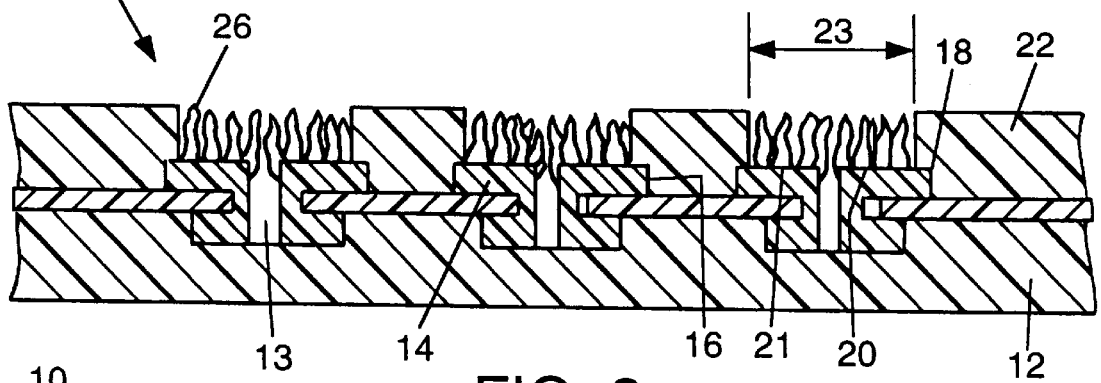
FIG. 3 shows an electronic structure with circuitry and uniform dendrites plated on the circuitry, according to an embodiment of the present invention, before the photoresist is stripped. The photoresist is shown disposed on the substrate, in contact with the side wall and over the edge of the side wall onto the top surface of the circuitry.

Referring now to FIG. 3, which shows another embodiment, an electronic structure 10 is shown with the photoresist 22 applied so that it leaves only a portion 23 of the top surface 20 of the circuitry 14 free of photoresist 22. Specifically, the photoresist 22 is exposed to actinic radiation through the art work so that only the photoresist 22 on a portion 23 of the top surface 20 of the circuitry 14 will not be exposed to actinic radiation. As a result, as shown in FIG. 3, upon development of the photoresist 22, the photoresist 22 remains on the substrate 12, surrounds and is contact with the side-wall 16 of the circuitry 14, the edge 18 of the circuitry 14 and the margin 21 of the top surface 20 of the circuitry 14; while only the central portion 23 of the top surface 20 of the circuitry 14 is not covered with photoresist 22.

Figure 4:
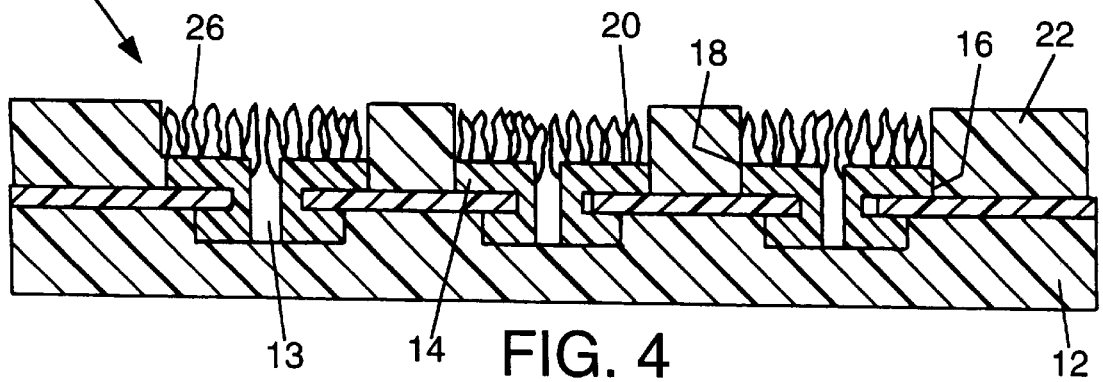
FIG. 4 shows an electronic structure with circuitry and uniform dendrites plated on the circuitry, according to an embodiment of the present invention, before the photoresist is stripped. The photoresist is disposed on the substrate, and in contact with the side wall but does not cover the edge of the top surface of the circuitry.

Referring now to FIG. 4, which shows another embodiment, electronic structure 10 is shown with the photoresist 22 applied so that the top surface 20 of the circuitry 14, upon which the dendrites are to be formed, is free of photoresist 22 and the substrate 12 is essentially completely covered in photoresist 22. The photoresist 22 is exposed to actinic radiation through art work, so that only the photoresist 22 on the top surface 20 of the circuitry 14 will not be exposed to actinic radiation. As a result, as shown in FIG. 4, upon development of the photoresist 22, the photoresist 22 remains upon the substrate 12 and surrounds and is in contact with the side wall 16 of the circuitry 14; while the top surface 20 of the circuitry 14, is free of photoresist 22. Alternatively, the circuitry 14 is flush with substrate 12; the photoresist is applied and developed in the same manner.

The photoresist is developed using conventional solvents, such as recommended by the photoresist manufacturer. Good results have been obtained developing Dupont 330R series photoresist with Butylcarbitol and sodium tetraborate.

The method has been described using negative photoresists that become solvent resistant upon exposure to actinic radiation so that the exposed photoresist will remain on the substrate after development. However, other conventional positive photoresists which become soluble to solvent upon exposure to actinic radiation, so that the exposed photoresist washes away during development, are also suitable. In such case, when employing positive photoresists, the windows in the art work are positioned over the circuitry area and the area where photoresist is desired, is not exposed.

After imaging, the dendrites are formed using conventional additive techniques, such as for example in conventional palladium plating baths. Methods of forming dendrites are described in U.S. Pat. No. 5,185,073 to Bindra, issued Feb. 9, 1993. A suitable method for forming dendrites involves preferably plating the circuitries with a thin layer of palladium or a thin layer of nickel followed by a thin layer of palladium to form a diffusion barrier. The substrate is preferably then placed in a conventional low palladium ion bath for about 5 to 15 minutes to form the palladium dendrites. Then the palladium dendrites are plated again with palladium for strength. Finally the photoresist is stripped using conventional stripping agents such as a mixture of butyl carbitol and ethanolamine, and the commoning bar is excised. The resulting dendrites are uniform. The dendrites are overplated with gold where corrosion resistance is desired.

The Substrate

Suitable substrates are those which dendrites are formed and include for example: thin film polyimide flex, rigid circuit panels such as epoxy glass laminate and silicon wafers, that is chips. Preferably, the circuitry on the substrate is a component of copper, nickel, palladium. The substrate has circuitization, such as pads, disposed on at least one side of the substrate.

The Photoresist

The photoresist withstands the alkaline pH of the plating baths, typically about 8 to 9, and the mechanical scrubbing due to hydrogen evolution in the bath. Preferably the photoresist develops below pH of about 7. Preferably the photoresist is a dry film photoresist. Good results have been obtained with dry film photoresists including, for example, semi-aqueous photoresists such as those available under the Trade name Dupont 300R series from Dupont, Dynachem AX from Dynachem and Shipley ED Eagle form Shipley. Where the photoresist is a dry film photoresist, the photoresist is preferably applied by lamination; good results have been obtained using Dupont 300R series from Dupont. Other photoresists are also suitable and include liquid photoresists which are applied by spin coating, screen coating, and other conventional application techniques.

A further advantage of the present method is that dendrites can be formed by roll plating. In the absence of the present method forming dendrites by roll line is impaired. The large dendrites are particularly subject to breakage as the work piece moves from the dendrite plating bath to the overplating bath. However, with the present method the uniform dendrites in conjunction with the mechanical protection offered by photoresist prevents the newly formed dendrites from being broken by roll line plating parts as the work piece progresses into the overplating bath.

The following examples are illustrative and not intended to limit the scope of the invention.

EXAMPLE 1

The workpiece composed of thin film polyimide flex 12 having printed circuits on both sides and copper pads 14 disposed over copper plated through holes 13. A commoning bar (not shown) was attached to the copper pads 14. A photoresist 22 having the trade name 330R from Dupont Company about 3 mil thick was applied by hot roll lamination to both sides of the polyimide flex 12. The back side, where no dendrites were to be formed, was blanket exposed to ultraviolet light. The front side was exposed through art work to ultraviolet light of about 365 nm according to the manufacturer's instructions. The photoresist 22 was developed using a developing solution of butyl carbitol and sodium tetraborate to reveal a photoresist free zone 24 extending from the side wall 16 of the pad 14 out to about 1.5 mil, as shown in FIG. 2. The workpiece was then placed in a conventional, pulse plating low palladium ion bath with a palladium tetraamine chloride concentration of about 1.5 g/L, plus or minus 30%, at a pH of about 8.5 with an average current duty cycle of 20%, a duty cycle of 0.5 milliseconds on and 2.0 milliseconds off, and a peak current density of 80 milliAmp/cm$^2$, for 10 minutes, to form palladium dendrites 26 about 40 micrometers high. This bath is subjected to ultrasonic agitation in cycles of 10 seconds on and 40 seconds off, to dislodge foreign hydrogen. Then the palladium dendrites 26 were reinforced with an overplating of palladium in a direct current palladium plating bath having palladium tetraamine chloride concentration of about 10 g/L, plus or minus 30%, at a pH of about 9 with a current density of about 10–15 milliamp/cm$^2$. Finally the photoresist 22 was stripped and the commoning bar excised.

EXAMPLE 2

The process of Example 1 was followed except that the photoresist 22 was photoimaged to extend to the sides 16, over the edge 18 and margin 21 of the pads 14 leaving only a portion 23 of the top surface 20 of the pad 14 exposed for dendrite formation as seen in FIG. 3. After the dendrites 26 were formed and the photoresist 22 was removed, the margin 21 and side walls 16 of the pads 14, under the area formerly protected by photoresist 22, were plated with a protective layer of palladium. Alternatively the margin 21 and side walls 16 of the pads 14, under the area formerly protected by photoresist 22 are etched to remove the margin 21 of the top surface 20 of the circuitry 14 which lacks dendrites.

EXAMPLE 3

The process of Example 1 was followed except that the photoresist 22 was photoimaged to extend to and abut the sides 16 of the pads 14 leaving the top surface 20 of the pads 14 exposed, so that dendrites 26 were formed on the exposed top surface 20 as seen in FIG. 4. After the photoresist was removed, the side walls 16 were then plated with a protective layer of palladium.

EXAMPLE 4

Dendrites 26 are formed on circuitry 14 on a substrate 12 as in Example 1 except that roll line plating equipment is employed to form the dendrites 26. The photoresist 22 is applied to the thickness of the desired dendrites plus or minus about 10%. The workpiece is then place on conventional line plating equipment and as the workpiece is moved into the first cell of the roll line plating equipment, the dendrites 26 are formed in the plating bath. The workpiece then proceed into the second cell, with minimal breakage, and the dendrites 26 are reinforced with palladium.

The pads from the workpieces of Examples 1 and 2 were examined under an optical microscope at a magnification of 10× and 100×. The dendrites were uniform and did not display enlarged dendrites at the edge of the pad. The heights were measured by z axis measurement scheme that focusing on the height of peaks and adjacent valleys, and measures the z axis displacement.

Having defined the invention, the invention is claimed as follows:

1. An electronic structure comprising:
   a substrate;
   circuitry disposed on the substrate; and
   uniform dendrites disposed on the circuitry, the dendrites comprised of edge dendrites and central dendrites:
   wherein the height of each of the dendrites is within about 25% of the average dendrite height and the height of the edge dendrites is within 10% of the height of the highest central dendrite.

2. The electronic structure of claim 1, wherein the electronic structure is a printed circuit board.

3. An electronic structure comprising: p1 a substrate;
   circuitry disposed on the substrate;
   uniform dendrites disposed on the circuitry;
wherein the height of each of the dendrites is within about 50% of the average dendrite height;
   wherein the dendrites are comprised of edge dendrites and central dendrites wherein the dendrites are further characterized in that the height of the edge dendrites is within 10% of the height of the highest central dendrite.

4. The electronic structure of claim 3, wherein the electronic structure is a printed circuit board.

5. The printed circuit board of claim 4, wherein the height of each of the dendrites is within about 25% of the average dendrite height and the height of the edge dendrites is within 10% of the height of the highest central dendrite.

* * * * *

UNITED STATES PATENT AND TRADEMARK OFFICE
CERTIFICATE OF CORRECTION

PATENT NO. : 5,939,786
DATED : August 17, 1999
INVENTOR(S) : Francis Joseph Downes, Jr., et. al.

It is certified that error appears in the above-identified patent and that said Letters Patent is hereby corrected as shown below:

Claim 3, line 14, after "comprising:" delete "p1".

Signed and Sealed this

Second Day of May, 2000

Attest:

Q. TODD DICKINSON

Attesting Officer

Director of Patents and Trademarks